(12) United States Patent
Savant et al.

(10) Patent No.: US 11,088,029 B2
(45) Date of Patent: Aug. 10, 2021

(54) GATE STACK TREATMENT

(71) Applicant: Taiwan Semiconductor Manufacturing Co., Ltd., Hsinchu (TW)

(72) Inventors: Chandrashekhar Prakash Savant, Hsinchu (TW); Chia-Ming Tsai, Hsinchu (TW); Ming-Te Chen, Hsinchu (TW); Shih-Chi Lin, Hsinchu (TW); Zack Chong, Hsinchu (TW); Tien-Wei Yu, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 16/376,432

(22) Filed: Apr. 5, 2019

(65) Prior Publication Data
US 2020/0098640 A1    Mar. 26, 2020

Related U.S. Application Data

(60) Provisional application No. 62/736,766, filed on Sep. 26, 2018.

(51) Int. Cl.
*H01L 21/8234* (2006.01)
*H01L 21/28* (2006.01)
(Continued)

(52) U.S. Cl.
CPC .............. *H01L 21/823437* (2013.01); *H01L 21/28088* (2013.01); *H01L 21/28158* (2013.01); *H01L 21/324* (2013.01); *H01L 21/76832* (2013.01); *H01L 21/823431* (2013.01); *H01L 21/823462* (2013.01); *H01L 27/0886* (2013.01);
(Continued)

(58) Field of Classification Search
CPC ......... H01L 21/02321; H01L 21/02337; H01L 21/28158; H01L 21/28185; H01L 21/823431; H01L 21/823437; H01L 21/823462
See application file for complete search history.

(56) References Cited

U.S. PATENT DOCUMENTS 9,960,053 B2    5/2018  Hou et al.
2008/0135984 A1  6/2008  Oh
(Continued)

FOREIGN PATENT DOCUMENTS

CN    106711034 A    5/2017
CN    107170683 A    9/2017
TW    201732904 A    9/2017

*Primary Examiner* — Matthew E Warren
(74) *Attorney, Agent, or Firm* — Sterne, Kessler, Goldstein & Fox P.L.L.C.

(57) ABSTRACT

The present disclosure describes a method for forming gate stack layers with a fluorine concentration up to about 35 at. %. The method includes forming dielectric stack, barrier layer and soaking the dielectric stack and/or barrier layer in a fluorine-based gas. The method further includes depositing one or more work function layers on the high-k dielectric layer, and soaking at least one of the one or more work function layers in the fluorine-based gas. The method also includes optional fluorine drive in annealing process, together with sacrificial blocking layer to avoid fluorine out diffusion and loss into atmosphere.

20 Claims, 13 Drawing Sheets

(51) Int. Cl.
    *H01L 21/768*     (2006.01)
    *H01L 29/66*     (2006.01)
    *H01L 27/088*     (2006.01)
    *H01L 29/78*     (2006.01)
    *H01L 29/49*     (2006.01)
    *H01L 21/324*     (2006.01)

(52) U.S. Cl.
    CPC .... *H01L 29/4966* (2013.01); *H01L 29/66795* (2013.01); *H01L 29/785* (2013.01)

(56) References Cited

U.S. PATENT DOCUMENTS

| | | |
|---|---|---|
| 2008/0164539 A1 | 7/2008 | Collaert et al. |
| 2017/0110324 A1* | 4/2017 | Tsai .................. H01L 21/76838 |
| 2017/0170027 A1* | 6/2017 | Hou .................... H01L 21/3215 |
| 2017/0236702 A1* | 8/2017 | Swenberg ............. H01L 29/517 |
| | | 438/784 |
| 2018/0040620 A1* | 2/2018 | Ha ....................... H01L 27/0924 |
| 2019/0139759 A1* | 5/2019 | Cheng ............... H01L 21/02321 |

\* cited by examiner

GATE STACK TREATMENT

CROSS-REFERENCE TO RELATED APPLICATION

This application claims the benefit of U.S. Provisional Patent Application No. 62/736,766, titled "Gate Dielectric Treatment," which was filed on Sep. 26, 2018 and is incorporated herein by reference in its entirety.

BACKGROUND

The threshold voltage of a transistor (e.g., p-type transistor) can be tuned by adjusting the thickness of work function layers within the transistor's gate structure. However, scaling the transistor gate structure to manufacture smaller devices introduces challenges in threshold voltage tuning as adjustments to the work function layer thickness is limited due to a decrease in spacing between transistors.

BRIEF DESCRIPTION OF THE DRAWINGS

Aspects of the present disclosure are best understood from the following detailed description when read with the accompanying figures. It is noted that, in accordance with common practice in the industry, various features are not drawn to scale. In fact, the dimensions of the various features may be arbitrarily increased or reduced for clarity of discussion.

DETAILED DESCRIPTION

Figure 1:
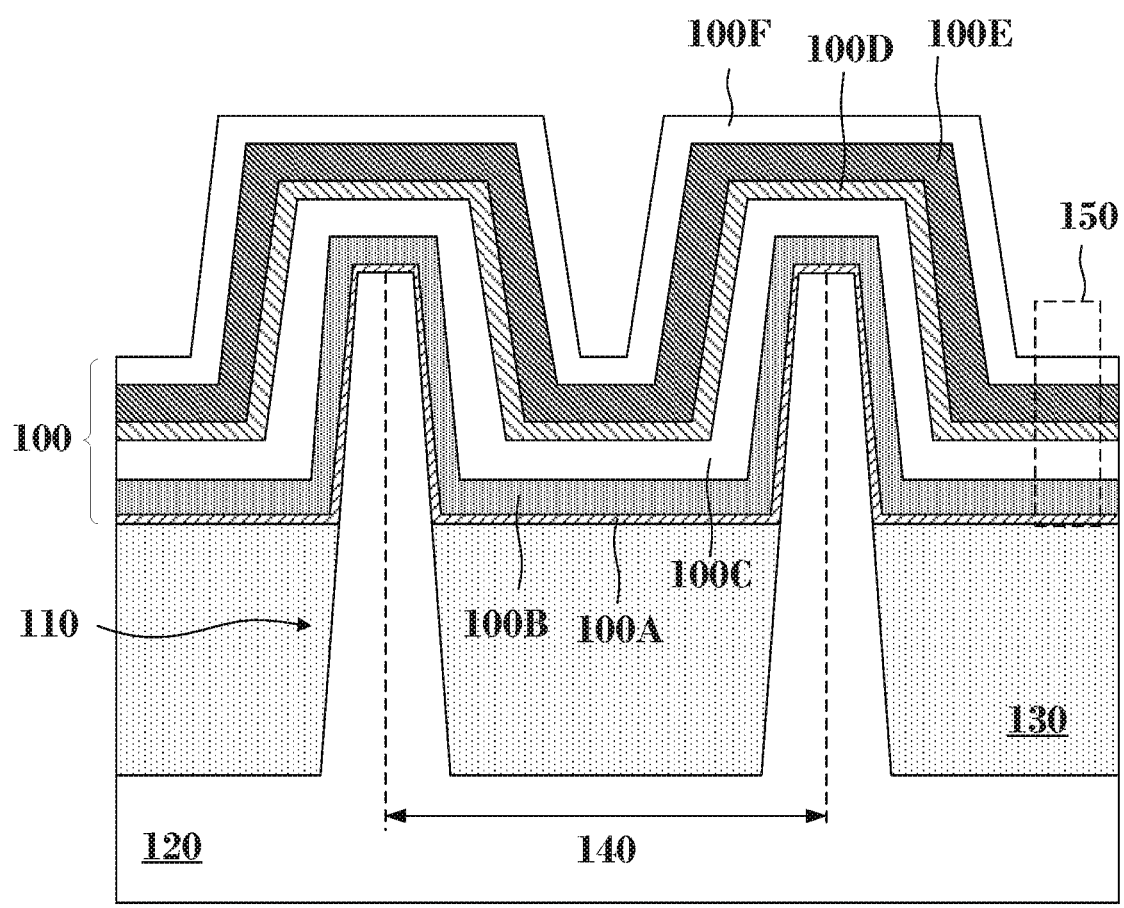
FIG. 1 is a cross-sectional view of a partially fabricated gate stack, in accordance with some embodiments.

The following disclosure provides different embodiments, or examples, for implementing different features of the provided subject matter. Specific examples of components and arrangements are described below to simplify the present disclosure. These are, of course, merely examples and are not intended to be limiting. For example, the formation of a first feature on a second feature in the description that follows may include embodiments in which the first and second features are formed in direct contact, and may also include embodiments in which additional features may be formed that are between the first and second features, such that the first and second features are not in direct contact.

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The term "nominal" as used herein refers to a desired, or target, value of a characteristic or parameter for a component or a process operation, set during the design phase of a product or a process, together with a range of values above and/or below the desired value. The range of values is typically due to slight variations in manufacturing processes or tolerances.

The term "about" as used herein indicates the value of a given quantity that can vary based on a particular technology node associated with the subject semiconductor device. In some embodiments, based on the particular technology node, the term "about" can indicate a value of a given quantity that varies within, for example, 5%-30% of the value (e.g., ±5%, ±10%, ±20%, or ±30% of the value).

The term "vertical," as used herein, means nominally perpendicular to the surface of a substrate.

The work function layers within the gate structure of a fin-based transistor (e.g., a fin field effect transistor or "finFET") control, in part, the threshold voltage of the transistor. More particularly, the threshold voltage value of a finFET depends on the collective thickness and type of the work function layers. Therefore, by controlling the thickness of the work function layers (or the number of the work function layers) in each finFET, it is possible to form finFETs with different threshold voltages on the same substrate. For example, finFETs with low threshold voltage can be used for the "low" or "ultra-low" power applications within the chip, and finFETs with a higher threshold voltage can be used for high power applications within the chip.

P-type finFETs and n-type finFETs exhibit a different absolute threshold voltage (e.g., the magnitude of the threshold voltage without regard to its sign) because the work function metals used in p-type finFETs and n-type finFETs can be different in terms of thickness, number, and/or composition. As a result, in absolute terms, p-type finFETs have a higher threshold voltage than n-type finFETs. For example, p-type finFETs require a higher voltage to turn-on (e.g., to allow current to flow between the source and the drain terminals of the transistor). For that reason, p-type finFETs can be referred to as "weak" compared to n-type finFETs. One way to reduce (e.g., lower) the threshold voltage of p-type finFETs is to increase the thickness of their respective work function layers. However, the thickness of the work function layers is limited by scaling constraints. For example, as the fin-to-fin pitch and the gate-to-gate pitch decreases, the available space for the work function layers reduces accordingly. Thus, increasing the thickness of one or more work function layers in p-type finFETs becomes challenging. For example, due to the limited space between the fins, existing or thicker work function layers can exhibit poor gap-fill, which can lead to voids and to an unpredictable threshold voltage variation across the wafer. Therefore, thicker or more work function layers for p-type finFETs may not be an option for future generation technology nodes.

Embodiments of the present disclosure are directed to a method that includes one or more fluorination operations, which can be applied to the gate stack layers of n-type and p-type finFETs. Each fluorination operation can introduce fluorine levels between about 0.01 atomic % and about 35 atomic %. Additionally, the fluorination operation can be applied to one or more layers of the gate stack, including, but not limited to, the gate dielectric, the barrier layer, and/or any of the work function layers of the gate stack. Further, the fluorination operation does not involve implants or high energy (e.g., plasma) processing that could damage the gate stack layers. In some embodiments, the fluorination operation includes soaking one or more gate stack layers to a fluorine-based gas (e.g., nitrogen trifluoride, $NF_3$; pure fluorine gas, $F_2$; etc.) at temperatures between about 70° C. and about 950° C. about 70° C., about 130° C., about 250° C., about 370° C., about 550° C., about 650° C., about 700° C., about 900° C.). If the fluorination operation is performed at the gate dielectric level and/or the barrier layer, an optional annealing operation can be performed to modulate the fluorine distribution within the gate dielectric and/or the barrier layer. In such case, a sacrificial blocking layer can be formed on the gate dielectric and/or the barrier layer to prevent out-diffusion of fluorine during the annealing operation. In some embodiments, fluorination of the gate dielectric reduces the trap centers in the gate dielectric by passivating oxygen vacancies and improving the reliability of the gate dielectric. In some embodiments, the fluorination of the gate dielectric reduces the density of interface trap (DIT) centers at the interface between the gate dielectric stack and the substrate through dangling bond passivation, which in turn improves the reliability of the gate dielectric stack. In some embodiments, fluorination of the barrier layer increases the work function of the barrier layer, which in turn decreases the threshold voltage of the p-type transistors. Further, barrier layer fluorination can improve the reliability of the gate dielectric stack by partially reducing the trap centers in the gate dielectric stack through oxygen vacancy passivation. In some embodiments, fluorination of the one or more work function layers increases the effective work function of these layers, decreases the threshold voltage of p-type transistors, and partially reduces the trap centers in the gate dielectric stack through oxygen vacancy passivation. Therefore, fluorination of the one or more work function layers can also improve the reliability of the gate dielectric stack.

FIG. 1 is a partially fabricated gate stack 100 on a top portion of fins 110, which are formed perpendicular to the top surface of a substrate 120. Isolation regions 130 electrically isolate fins 110. Further, isolation regions 130 electrically isolate partially fabricated gate stack 100 from substrate 120. By way of example and not limitation, substrate 120 can be a bulk semiconductor wafer (e.g., silicon wafer) or a semiconductor-on-insulator wafer (e.g., silicon-on-insulator, SOI). In some embodiments, fins 110 can include (i) silicon, (ii) a compound semiconductor such as gallium arsenide (GaAs), gallium phosphide (GaP), indium phosphide (InP), indium arsenide (InAs), and/or indium antimonide (InSb), silicon germanium (SiGe), (iii) an alloy semiconductor including, gallium arsenide phosphide (GaAsP), aluminum indium arsenide (AlInAs), aluminum gallium arsenide (AlGaAs), gallium indium arsenide (GaInAs), gallium indium phosphide (GaInP), and/or gallium indium arsenide phosphide (GaInAsP), or (iv) combinations thereof. In some embodiments, isolation regions 130 are shallow trench isolation (STI) structures that include a silicon-based dielectric material such as silicon oxide ($SiO_2$), silicon nitride ($Si_3N_4$), silicon oxynitride (SiON), fluorine-doped silicate glass (FSG), a low-k dielectric material (e.g., with a k-value less than about 3.9), and/or other suitable dielectric materials with appropriate gap fill properties.

Partially fabricated gate stack 100 includes several vertically stacked layers, as shown in FIG. 1. By way of example and not limitation, partially fabricated gate stack 100 can include an interfacial dielectric 100A, a high-k dielectric layer 100B, a capping layer 100C, a barrier layer 100D, a work function stack 100E, and a metal gate layer 100F. In some embodiments, interfacial dielectric 100A is a silicon oxide-based dielectric, and high-k dielectric layer 100B is a high-k material with a dielectric constant (k-value) greater than about 3.9 (e.g., about 4.0, about 10, about 20, about 30, etc.). By way of example and not limitation, interfacial dielectric 100A can include silicon oxide, germanium oxide, and/or silicon oxynitride, and high-k dielectric layer 100B can include hafnium oxide, lanthanum, oxide, aluminum oxide, yttrium oxide or combinations thereof. In some embodiments, interfacial dielectric 100A and high-k dielectric layer 100B form a gate dielectric stack within partially fabricated gate stack 100. Capping layer 100C is deposited to absorb oxygen from the gate dielectric stack and to protect high-k dielectric layer 100B during the formation of barrier layer 100D, work function stack 100E, and metal gate layer 100F. In some embodiments, capping layer 100C improves the reliability of the gate stack (e.g., interfacial dielectric 100A and high-k dielectric layer 100B). By way of example and not limitation, capping layer 100C can be a titanium nitride (TiN) layer or a composite material such as titanium silicon nitride (TiSiN). Further, barrier layer 100D can be, for example, a tantalum nitride (TaN) layer.

In some embodiments, work function stack 100E includes one or more individual work function layers not shown in FIG. 1 for simplicity. The collective thickness of the work function layers in work function stack 100E can set the threshold voltage of the transistor. In some embodiments, each of the work function layers includes titanium nitride and/or tungsten nitride and can have a thickness that ranges from about 8 Å to about 16 Å. Finally, metal gate layer 100F can include a titanium-aluminum alloy or a tantalum-aluminum alloy. In some embodiments, partially fabricated gate stack 100 includes additional layers that are not shown in FIG. 1 for simplicity. These additional layers may include, additional barrier layers, metal or metallic fill layers, glue layers, contact layers, etc.

Figure 2:
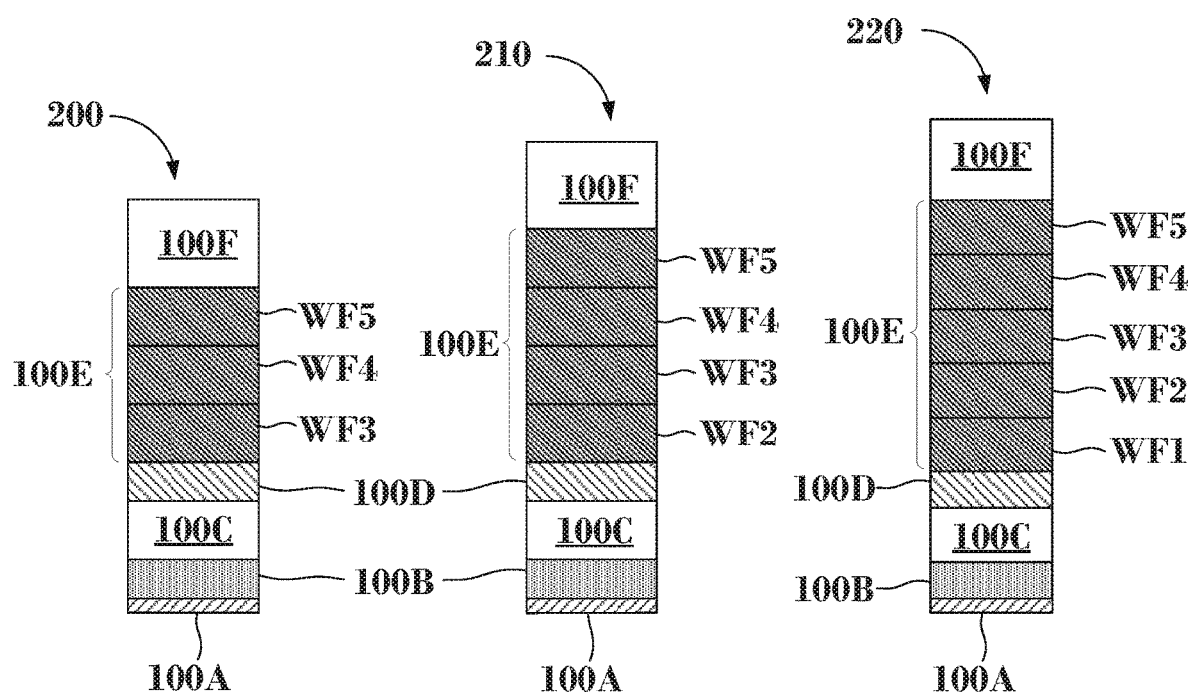
FIG. 2 is a magnified view of work function layers in partially fabricated gate stacks of p-type transistors, in accordance with some embodiments.

FIG. 2 is a series of magnified views of area 150 of the partially fabricated gate stack 100, shown in FIG. 1, for exemplary p-type transistors 200, 210, and 220. In some embodiments, each of p-type transistors 200, 210, and 220 has a different threshold voltage value based on the number and thickness of work functions layers WF1, WF2, WF3, WF4, and WF5 within work function stack 100E. For example, the greater the number of work function layers in work function stack 100E or the thicker the work function stack 100E, the lower the threshold voltage value of the resulting transistor. Thus, the threshold voltage of p-type transistor 220 is lower than the threshold voltage of p-type transistor 210; and the threshold voltage of p-type transistor 210 is lower than the threshold voltage of p-type transistor 200. By way of example and not limitation, p-type transistor 220 can have a threshold voltage suitable for ultra-low power applications in a chip, p-type transistor 210 can have a threshold voltage suitable for low power applications in a chip, p-type transistor 200 can have a threshold voltage suitable for standard power applications in a chip. Further, p-type transistors 210 and 220 can be formed alongside p-type transistor 220 because p-type transistors 200, 210, and 220 include common work function layers (e.g., WF3, WF4, and WF5)—which can be deposited concurrently for p-type transistors 200, 210, and 220.

In some embodiments, work function layers WF1, WF2, WF3, WF4, and WF5 have an equal or different thickness and a similar or different composition (e.g., titanium to nitrogen mole ratio, tungsten to nitrogen mole ratio). Further, more work function layers, or thicker work function layers, may not provide additional benefit in terms of lowering the threshold voltage value of p-type transistor 220. For example, as the number of work function layers increases, the effect on the threshold voltage weakens. This is because the added work function layers, and/or the formation of thicker work function layers, "pushes" the top work function layers (e.g., WF4 and WF5 layers) further away from the channel, where the influence to the channel is weaker. Therefore, additional work function layers may not necessarily result in a lower threshold voltage value for the p-type transistors. Furthermore, as the fin-to-fin pitch 140 (e.g., shown in FIG. 1) shrinks between technology nodes, the space available for the deposition of partially fabricated gate stack 100 reduces proportionally. Therefore, an additional number of work function layers will occupy a larger portion of the available space between fins 110, which reduces the available space for the rest of the layers (e.g., WF4 layer, WF5 layer, 100F layer etc.) in the gate stack.

Figure 3A:
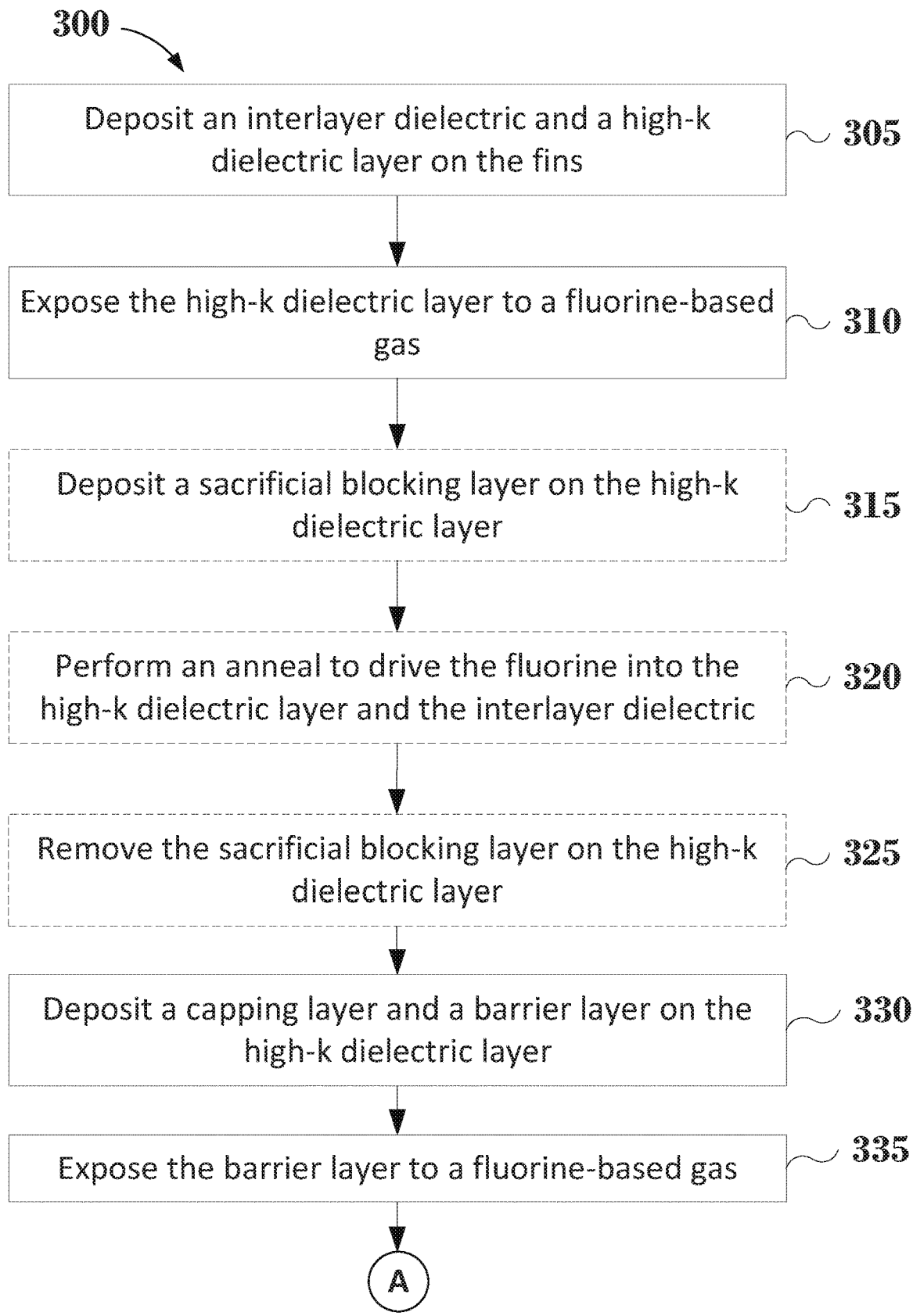
FIGS. 3A and 3B is a method for the formation of a gate stack that includes fluorination operations and optional annealing operations, in accordance with some embodiments.
Figure 3B:
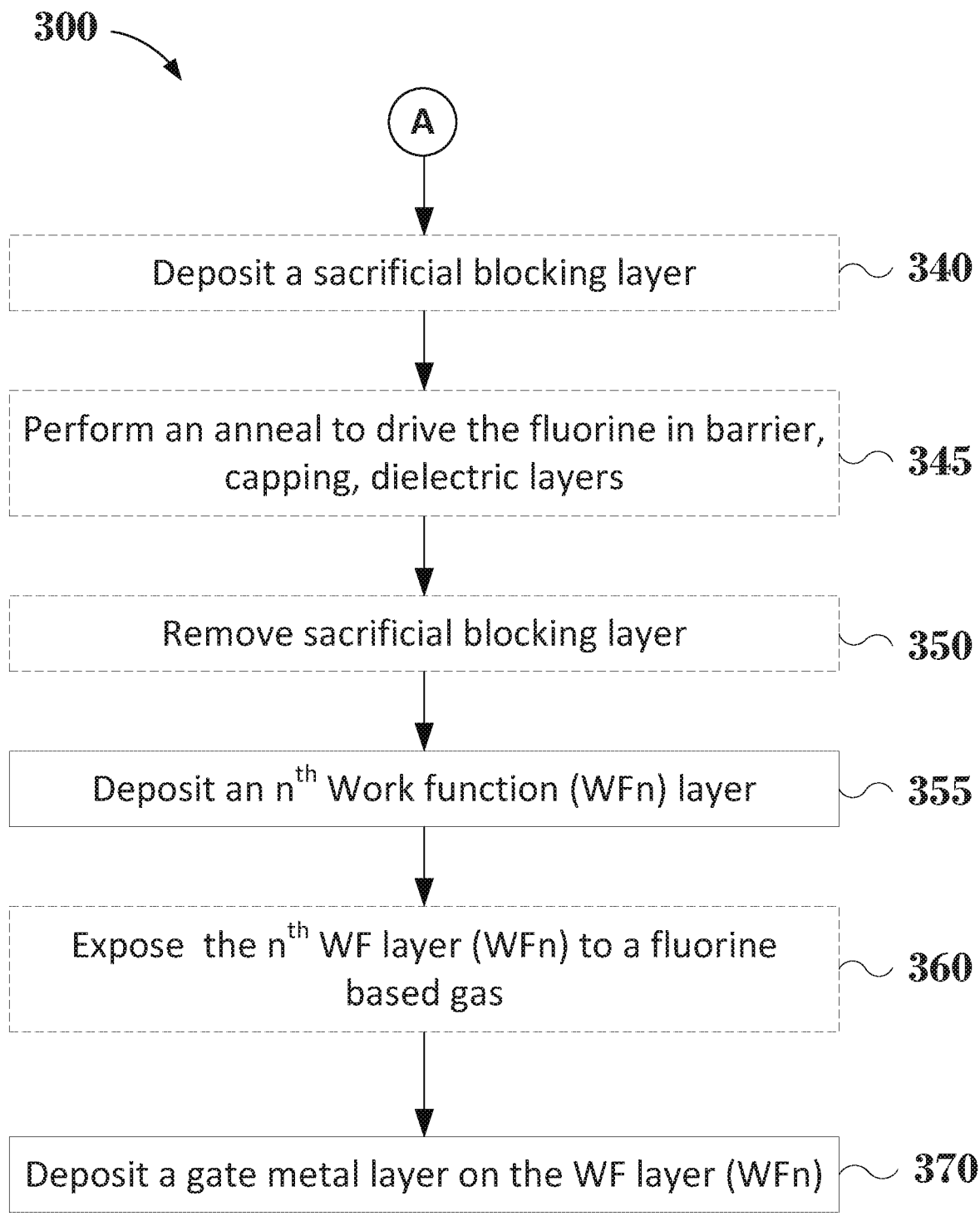

In some embodiments, fluorinating selective layers of partially fabricated gate stack 100 can lower the threshold voltage of p-type transistors 200, 210, and 220 and improve the transistor's reliability. FIGS. 3A and 3B are a flow chart of an exemplary method 300 that includes fluorination operations that further reduce the threshold voltage of p-type transistors and improve the reliability of the dielectric stack in both p-type and n-type transistors. Other fabrication operations may be performed between the various operations of method 300 and may be omitted merely for clarity. Embodiments of the present disclosure are not limited to method 300.

Figure 4:
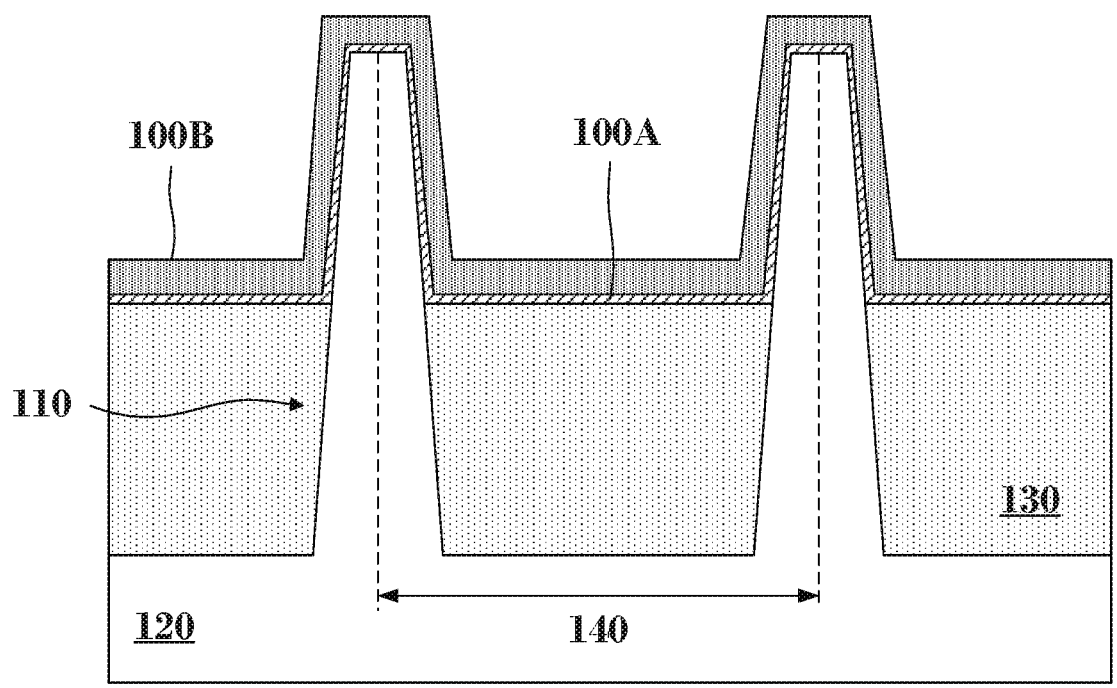
FIG. 4 is a cross-sectional view of a partially fabricated gate stack, in accordance with some embodiments.

In referring to FIG. 3A, method 300 begins with operation 305 and the deposition of interfacial dielectric 100A and high-k dielectric layer 100B on the exposed portions of fins 110 and the top surface of isolation regions 130. According to some embodiments, FIG. 4 shows the resulting structure. By way of example and not limitation, interfacial dielectric 100A and high-k dielectric layer 100B can be blanket deposited in succession using atomic layer deposition (ALD) or plasma-enhance atomic layer deposition (PEALD) methods. In some embodiments, interfacial dielectric 100A and high-k dielectric layer 100B together form the gate dielectric stack of partially fabricated gate stack 100.

Figure 5:
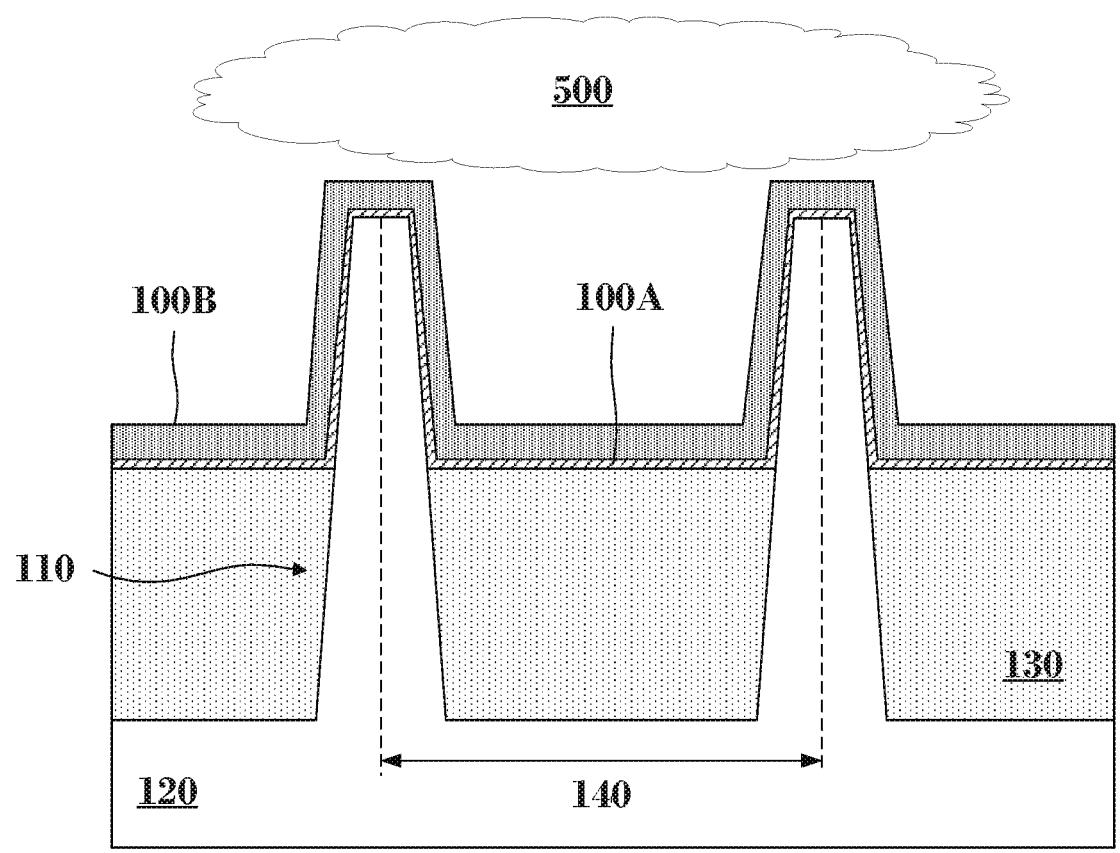
FIG. 5 is a cross-sectional view of a partially fabricated gate stack during a fluorination operation, in accordance with some embodiments.

In referring to FIGS. 3A and 5, method 300 continues with fluorination operation 310, where high-k dielectric layer 100B is exposed to (e.g., soaked in) a fluorine-based gas 500. By way of example and not limitation, fluorine-based gas 500 is a fluorine source (e.g., a fluorine precursor) such as pure fluorine gas ($F_2$), nitrogen trifluoride ($NF_3$), fluoroform ($CHF_3$), tetrafluoromethane ($CF_4$), sulfur hexafluoride ($SF_6$), hexafluoroethane ($C_2F_6$), or combinations thereof. The above-mentioned list of fluorine-based gases is not exhaustive and additional fluorine-based gases may be used. In some embodiments, fluorine-based gas 500 thermally decomposes on the surface of high-k dielectric layer 100B or in the ambient above the surface of high-k dielectric layer 100B. According to some embodiments, the surface of high-k dielectric layer 100B, the surface of barrier layer 100D, the surfaces of work function layers WF1/WF2/WF3/WF4/WF5 of work function stack 100E can act as catalyst for the thermal decomposition of fluorine-based gas 500. To thermally decompose fluorine-based gas 500, substrate 120 is heated to a temperature between about 70° C. and about 950° C. (e.g., at about 70° C., at about 100° C., at about 200° C., at about 300° C., at about 325° C., at about 650° C., at about 800° C., at about 900° C., etc.). For processing temperatures below about 70° C., fluorine-based gas 500 may not actively decompose on the surface of high-k dielectric layer 100B or in the ambient above high-k dielectric layer 100B. Therefore, processing temperatures below 70° C. may limit the amount of fluorine that will be incorporated into high-k dielectric layer 100B. On the other hand, at processing temperatures above about 950° C., high-k dielectric layer 100B can become polycrystalline and form grain boundaries. The grain boundaries in high-k dielectric layer 100B can become a potential path for electrical charge between the gate stack and the fin and are therefore undesirable. Further, at high processing temperatures (e.g., above 950° C.) interfacial dielectric 100A can grow thicker, which can reduce the combined dielectric constant (k-value) of interfacial dielectric 100A and high-k dielectric layer 100B, and negatively impact the electrical behavior of the transistor. According to some embodiments, exposing high-k dielectric layer 100B to fluorine-based gas 500 is a "thermal treatment" that does not physically damage the exposed high-k dielectric layer 100B or interfacial dielectric 100A.

According to some embodiments, the soaking time for fluorination operation 310 ranges from about 1 s to about 30 min (e.g., from about 1 s to about 20 s, from about 15 s to about 1 min, from about 50 s to about 5 min, from about 1 min to about 10 min, from about 5 min to about 20 min, from about 10 min to about 30 min). Further the ambient pressure during the soaking process can range from about 0.5 Torr to about 150 Torr (e.g., from about 0.5 Torr to about 10 Torr, from about 5 Torr to about 50 Torr, from about 30 Torr to about 75 Torr, from about 60 Torr to about 100 Torr, from about 90 Torr to about 150 Torr). The above mentioned process parameters (e.g., soaking time and ambient pressure) are exemplary and not limiting. The soaking time and ambient pressure can be further tuned depending on the desired amount of fluorine to be incorporated in high-k dielectric layer 100B. For example, the combination of a long soaking time (e.g., 10 min) and a high ambient pressure (e.g., 70 Torr) can favor the incorporation of higher amounts of fluorine in high-k dielectric layer 100B. However, long soaking times (e.g., longer than about 30 min) can decrease throughput and increase fluorine-based gas consumption, thus the manufacturing cost. Furthermore, the soaking time and the ambient pressure may be further adjusted depending on the type of fluorine-based gas 500, the type of high-k dielectric layer 100B, and other factors (e.g., the geometry of the reactor where the fluorination operation takes place).

In some embodiments, during operation 310, some fluorine diffuses through high-k dielectric layer 100B towards the interface with interfacial dielectric 100A. Fluorine diffusion, through high-k dielectric layer 100B, is a desirable effect that has the following benefits: (i) purifies high-k dielectric layer 100B by removing carbon and/or chlorine byproducts contamination originating from the deposition process of high-k dielectric layer 100B, and (ii) reduces trap centers in high-k dielectric layer 100B (e.g., at the interface between high-k dielectric layer 100B and interfacial dielectric 100A) and at the interface between interfacial dielectric 100A and the channel in fin 110. In some embodiments, trap centers are reduced via oxygen vacancy passivation in high-k dielectric 100B and via dangling bond passivation at the interface between interfacial dielectric 100A and the channel in fin 110. Consequently, fluorine diffusion through high-k dielectric layer 100B can improve the transistor's reliability—e.g., reduces the negative bias temperature instability (nBTI), leakage current (Igi), and time dependent dielectric breakdown (TDDB). Therefore, operation 310 can be beneficial for both n-type and p-type transistors.

In some embodiments, the fluorine concentration that can be incorporated in high-k dielectric layer 100B can range from about 0.01 atom % ("at. %") to about 35 at. % (e.g., from about 0.01 at. % to about 1 at. %, from about 0.5 at. % to about 5 at. %, from about 3 at. % to about 10 at. %, from 8 at. % to about 25 at. %, from about 20 at. % to about 35 at. %, etc.) depending on process parameters such as the type of fluorine-based gas 500, the process temperature, the ambient pressure, and the soaking time. For example, for a given soaking time (e.g., about 1 min), the combination of higher process temperature (e.g., about 300° C.) and ambient pressure (e.g., about 50 Torr) can result in a higher fluorine concentration. Conversely, and for the same soaking time (e.g., about 1 min), the combination of lower process temperature (e.g., about 200° C.) and ambient pressure (e.g., about 1 Torr) can result a lower fluorine concentration.

By way of example and not limitation, operation 310 can be performed in-situ or ex-situ. For example, operation 310 can be performed without a vacuum break after the deposition of high-k dielectric layer 100B or with a vacuum break in a standalone reactor. If operation 310 is performed in-situ, then the deposition reactor of high-k dielectric layer 100B can be fitted with gas delivery lines for the delivery of fluorine-based gas 500.

According to some embodiments, the peak of the fluorine concentration after operation 310 is closer to the surface of high-k dielectric layer 100B and progressively tapers off towards the interface between high-k dielectric layer 100B and interfacial dielectric 100A. In some embodiments, the fluorine peak concentration is located between about 1 Å and about 12 Å from the treated surface of high-k dielectric layer 100B. In some embodiments, the fluorine peak concentration extends between about 5% to about 75% of the total thickness of high-k dielectric layer 100B.

In some embodiments, the fluorine distribution within high-k dielectric layer 100B and interfacial dielectric 100A can be modified with an optional annealing operation applicable to both n-type and p-type transistors. By way of example and not limitation, if an optional annealing operation is performed, a sacrificial blocking layer is deposited on high-k dielectric layer 100B to prevent fluorine out-diffusion during the annealing. The sacrificial blocking layer can be subsequently removed after the annealing.

In some embodiments, the deposition of the sacrificial blocking layer, the annealing operation, and the removal of the sacrificial blocking layer are all optional operations that can be performed to further modulate the fluorine distribution within high-k dielectric layer 100B and interfacial dielectric 100A (e.g., to drive the fluorine atoms deeper into the gate dielectric stack). These optional operations correspond to optional operations 315-325 of method 300 shown in FIG. 3A.

Figure 6:
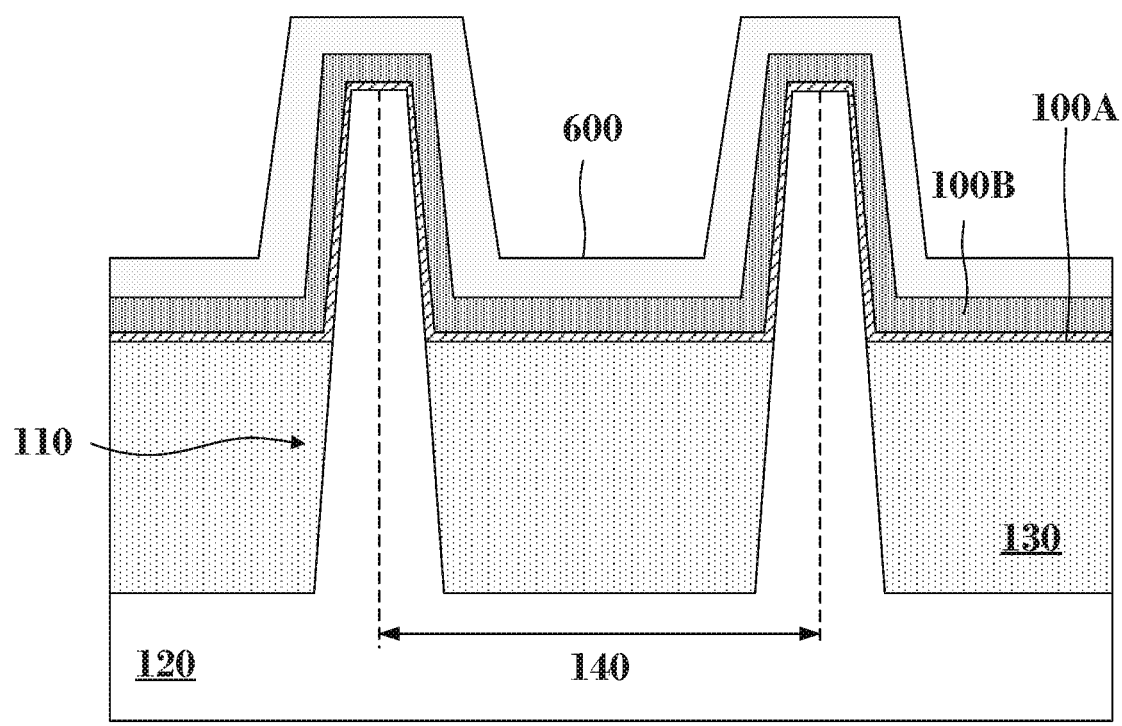
FIG. 6 is a cross-sectional view of a partially fabricated gate stack after the formation of a sacrificial blocking layer, in accordance with some embodiments.

In operation 315 a sacrificial blocking layer 600 can be deposited on high-k dielectric layer 100B as shown in FIG. 6. By way of example and not limitation, sacrificial blocking layer 600 can be a silicon layer or a titanium nitride layer that can be later removed with a wet etching chemistry. As discussed above, the purpose of sacrificial blocking layer 600 is to block or suppress the out-diffusion of fluorine from high-k dielectric layer 100B back to the ambient above high-k dielectric layer 100B. For example, fluorine out-diffusion can occur during the subsequent annealing operation. According to some embodiments, sacrificial blocking layer 600 can be deposition by ALD or PEALD with a thickness that ranges from about 5 Å to about 100 Å (e.g., from about 5 Å to about 10 Å, from about 5 Å to about 20 Å, from about 15 Å to about 30 Å). A sacrificial blocking layer below 5 Å may be unable to prevent fluorine out-diffusion. And even though a sacrificial blocking layer thicker than about 100 Å can prevent out-diffusion of fluorine, it will require a longer deposition time and removal process.

Figure 7:
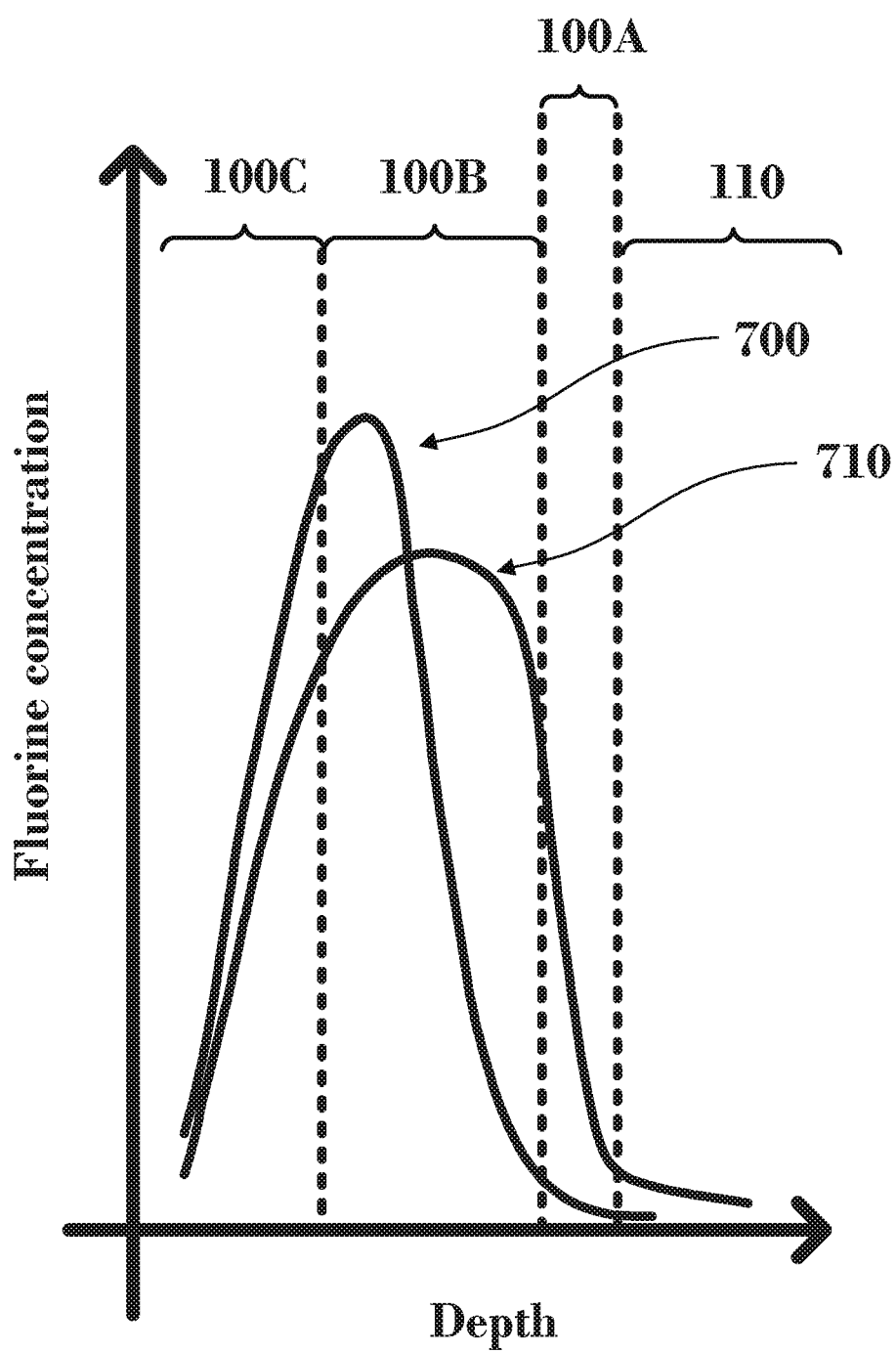
FIG. 7 is a secondary ion mass spectrometry (SIMS) plot of two fluorine distribution profiles in a high-k dielectric layer and interfacial dielectric layer of a partially fabricated gate stack, in accordance with some embodiments.

In referring to FIG. 3A, method 300 may continue with optional annealing operation 320. In some embodiments, the optional annealing operation 320 is performed at a temperature range between about 70° C. and about 550° C. (e.g., about 70° C., about 100° C., about 200° C., about 250° C., about 325° C., etc.) for about 2 s to about 300 s to "drive-in" the fluorine atoms towards interfacial dielectric 100A. In some embodiments, optional annealing operation 320 is performed in nitrogen ambient, in forming gas ambient (e.g., nitrogen/hydrogen gas mixture), in ammonia ambient, or in diluted oxygen ambient (e.g., oxygen/nitrogen gas mixture). According to some embodiments, after the annealing operation 320, the distribution of the fluorine concentration can shift deeper into high-k dielectric layer 100B (e.g., towards the interface with interfacial dielectric 100A). By way of example, FIG. 7 shows two fluorine distribution profiles obtained by secondary ion mass spectrometry (SIMS) for a high-k dielectric layer 100B/interfacial dielectric 100A stack, according to some embodiments. The y-axis in FIG. 7 represents the fluorine atomic concentration, and the x-axis represents the depth in the high-k dielectric layer 100B/interfacial dielectric 100A stack—with high-k dielectric layer 100B being the top layer and interfacial dielectric 100A being the bottom layer of the stack. The fluorine distribution plot in FIG. 7 shows two different fluorine distributions within high-k dielectric layer 100B and interfacial dielectric 100A that have been obtained with and without the optional annealing operation 320. For example, in FIG. 7, after fluorination operation 310, the fluorine distribution within high-k dielectric layer 100B and interfacial dielectric 100A (the relative thickness and location of which are represented by the vertical dotted lines) is represented by curve 700. On the other hand, after the optional annealing operation 320, the fluorine distribution within high-k dielectric layer 100B and interfacial dielectric 100A is represented by curve 710. According to some embodiments, fluorine distribution 710 (e.g., after the optional annealing operation 320) develops a larger full width at half maximum (FWHM) compared to the "original" fluorine distribution 700 obtained during fluorination operation 310. In other words, the fluorine distribution 710 is "wider" and more evenly distributed within high-k dielectric layer 100B (e.g., compared to fluorine distribution 700) and extends deeper into high-k dielectric layer 100B and interfacial dielectric 100A.

In some embodiments, the optional annealing operation 320 does not exceed temperatures of about 550° C. to avoid damaging high-k dielectric layer 100B, interfacial dielectric 100A, and substrate 120 from consecutive high temperature processing. For example, lower annealing temperatures (e.g., below about 550° C.) keep the overall thermal budget of the optional annealing operation 320 at low levels. According to some embodiments, the lower annealing temperatures may require longer annealing times to achieve the fluorine distribution 710 of FIG. 7. Conversely, higher annealing temperature may require shorter annealing times to achieve the fluorine distribution 710 of FIG. 7. In some embodiments, different combinations of annealing temperatures and annealing times can result in similar or different fluorine distribution from fluorine distribution 710 shown in FIG. 7. For example, a combination of annealing time and temperature can provide a fluorine distribution between fluorine distributions 700 and 710.

According to some embodiments, if a fluorine drive-in process is required and optional annealing operation 320 is performed, the process temperature of operation 310 can be low (e.g., close to about 70° C.) so that the collective thermal budget of both operations is kept at low levels. For example, with optional annealing operation 320, the temperature of operation 310 can be set at about 70° C., while the optional annealing operation 320 can be performed at about 250° C. On the other hand, without the optional annealing operation 320, the temperature of operation 310 can be set higher at about 300° C.).

After optional annealing operation 320, sacrificial blocking layer 600 is removed according to operation 325 of method 300 shown in FIG. 3A. By way of example and not limitation, sacrificial blocking layer 600 can be removed with a wet etching chemistry, such as a solution that includes hydrochloric acid, hydrogen peroxide, and water (HPM); ammonium hydroxide; phosphoric acid; and/or hydrofluoric acid. According to some embodiments, the formation of partially fabricated gate stack 100 may resume after the removal of sacrificial blocking layer 600.

As discussed above, operations 315, 320, and 325 are optional and are also configured to enhance reduction of trap centers at the interface between high-k dielectric layer 100B and interfacial dielectric 100A by oxygen vacancy and dangling bond passivation in interfacial dielectric 100A—thereby improving the reliability of both n-type and p-type transistors. In some embodiments, method 300 can perform operation 310 and then proceed to operation 330.

Method 300 continues with operation 330, in which capping layer 100C and barrier layer 100D are deposited on high-k dielectric layer 100B as shown in FIG. 1. In some embodiments, capping layer 100C and barrier layer 100D are blanket deposited with a conformal deposition method, such as for example ALD, PEALD, chemical vapor deposition (CVD), plasma enhanced CVD (PECVD), etc.

Figure 8:
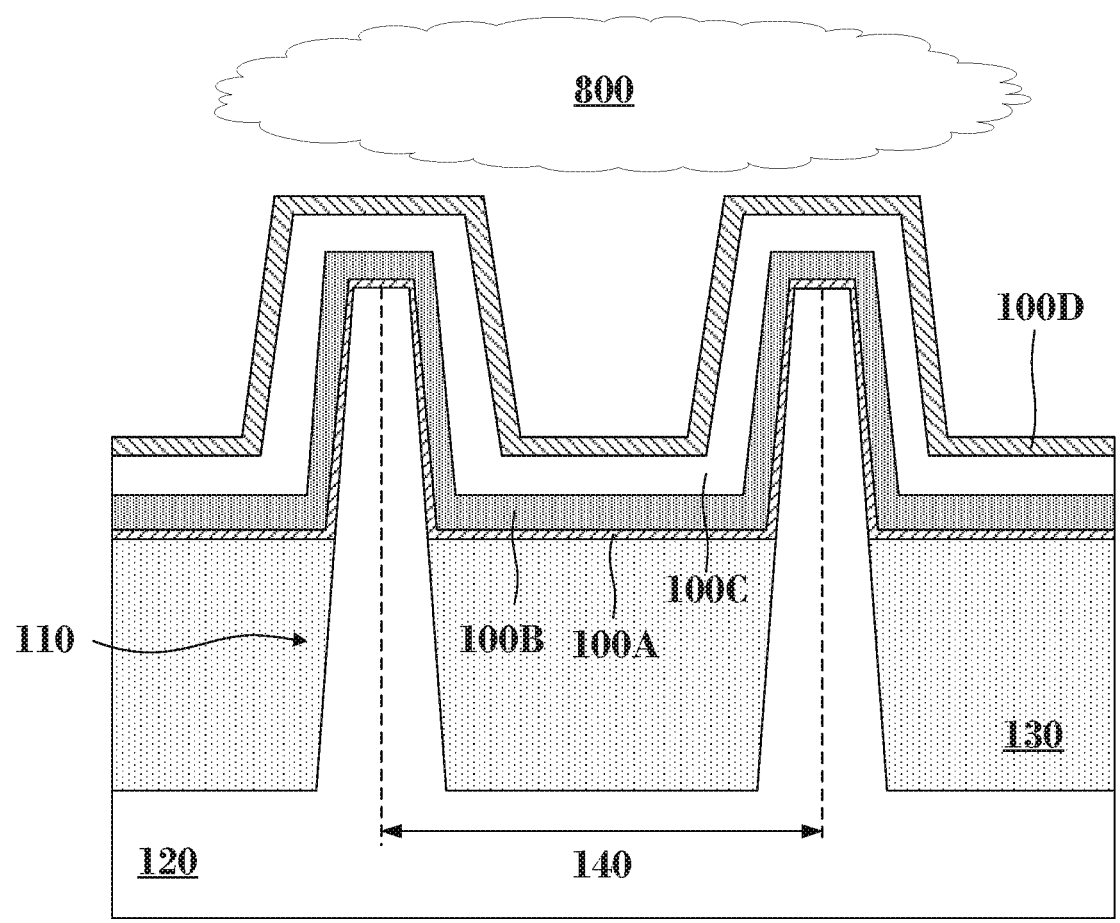
FIG. 8 is a cross-sectional view of a partially fabricated gate stack during a fluorination operation of a barrier layer, in accordance with some embodiments.

Method 300 continues with fluorination operation 335, where the barrier layer 100D is exposed (or soaked) to a fluorine-based gas 800 as shown in FIG. 8. In some embodiments, fluorination operation 335 is similar to fluorination operation 310. For example, fluorine-based gas 800 in fluorination operation 335 can be $F_2$, $NF_3$, $CHF_3$, $CF_4$, $SF_6$, $C_2F_6$, or combinations thereof. Further, the processing temperature for fluorination operation 335 can be between about 70° C. and about 950° C., and the soaking time can range from about 1 s to about 30 min. Further the ambient pressure during the soaking process can range from about 0.5 Torr to about 150 Torr.

In some embodiments, and depending on the processing conditions (e.g., the type of fluorine-based gas, the soaking time, the process pressure and temperature), the total fluorine concentration that can be incorporated in barrier layer 100D can range from about 0.01 at. % to about 35 at. %. In some embodiments, fluorination of barrier layer 100D increases its work function and subsequently lowers the threshold voltage of the p-type transistor. By way of example and not limitation, the higher the fluorine concentration, the lower the resulting threshold voltage value for the p-type transistor. In some embodiments, fluorine incorporation above about 35 at. % does not provide substantial threshold voltage benefits for p-type transistors for example, it does not further lower the threshold voltage value of the p-type transistors.

Figure 9:
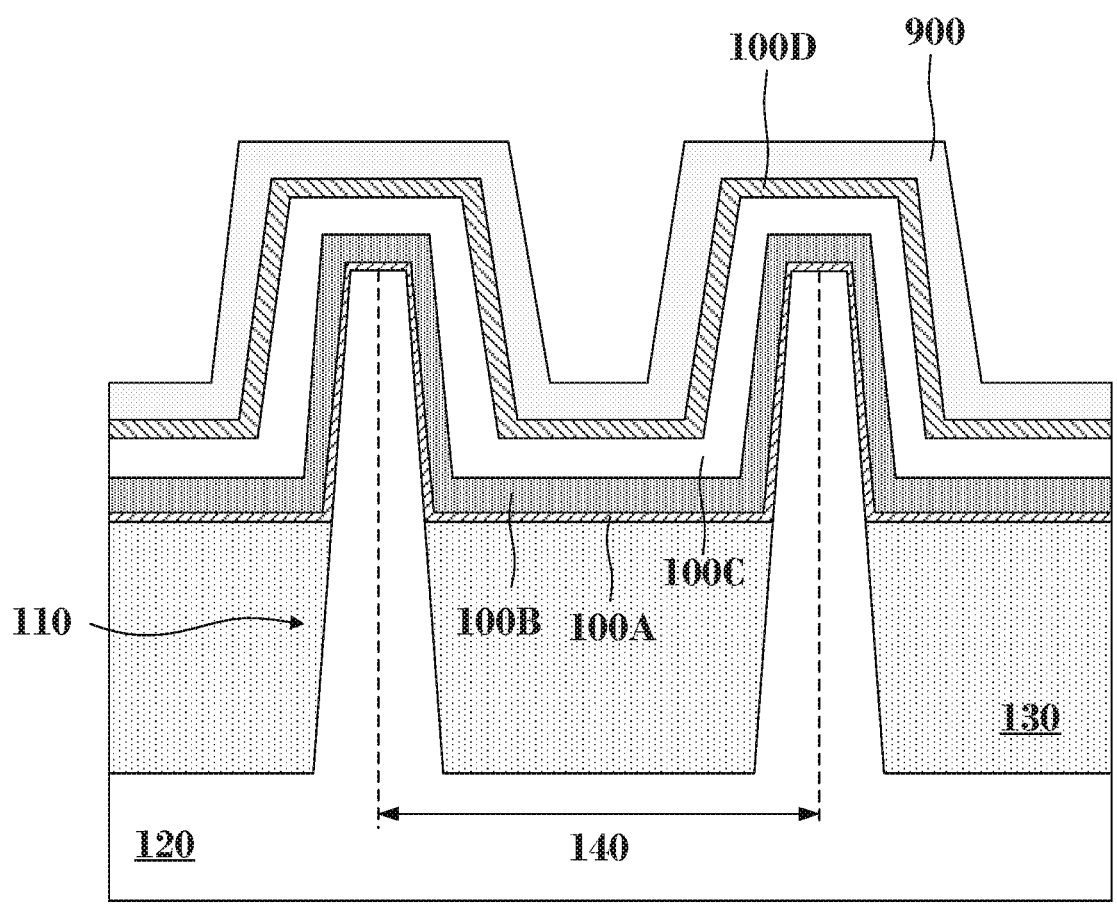
FIG. 9 is a cross-sectional view of a partially fabricated gate stack after the formation of a sacrificial blocking layer on a barrier layer, in accordance with some embodiments.

In some embodiments, to "drive-in" the fluorine atoms through capping layer 100C towards high-k dielectric layer 100B and interfacial dielectric 100A, method 300 includes optional operations 340-350 shown in FIG. 3B. For example, and in referring to FIG. 3B, method 300 may continue with optional operation 340 and the deposition of a sacrificial blocking layer 900 on barrier layer 100D, as shown in FIG. 9. In some embodiments, blocking sacrificial layer 900 of operation 340 is similar to sacrificial blocking layer 600 of operation 315 shown in FIG. 6. For example, sacrificial layer 900 of operation 340 can include a silicon layer or a titanium nitride layer that can be later removed with a wet etching chemistry. Accordingly, sacrificial layer 900 of operation 340 can be deposited by ALD or PEALD with a thickness that ranges from about 5 Å to about 100 Å (e.g., from about 5 Å to about 10 Å, from about 5 Å to about 20 Å, from about 15 Å to about 30 Å). In some embodiments, a sacrificial blocking layer below 5 Å may be unable to prevent fluorine out-diffusion, and a sacrificial blocking layer that is thicker than about 100 Å requires a longer deposition time and removal process—which can increase the process time and the IC fabrication cost.

In some embodiments, annealing operation 345 shown in FIG. 3B is similar to operation 320. For example, in some embodiments, the optional annealing operation 345 is performed in nitrogen ambient, in forming gas ambient (e.g., nitrogen/hydrogen gas mixture), in ammonia ambient, or in diluted oxygen ambient (e.g., oxygen/nitrogen gas mixture) at a temperature range between about 70° C. and about 550° C. (e.g., about 70° C., about 100° C., about 200° C., about 250° C., about 325° C., etc.) for about 2 s to about 300 s to "drive-in" the fluorine atoms towards capping layer 100C, high-k dielectric layer 100B, and interfacial dielectric 100A. According to some embodiments, after annealing operation 345, the distribution of the fluorine concentration shifts deeper into barrier layer 100D, capping layer 100C, and high-k dielectric layer 100B.

In referring to FIG. 3B, method 300 continues with operation 350, where sacrificial layer 900 deposited in operation 340 is removed with a wet etching chemistry. In some embodiments, the sacrificial blocking layer removal operation 350 is similar to operation 325. By way of example and not limitation, HPM (e.g., a solution that includes hydrochloric acid, hydrogen peroxide, and water), ammonium hydroxide, phosphoric acid, and/or hydrofluoric acid can be used to remove the sacrificial blocking layer in operation 350.

Figure 10:
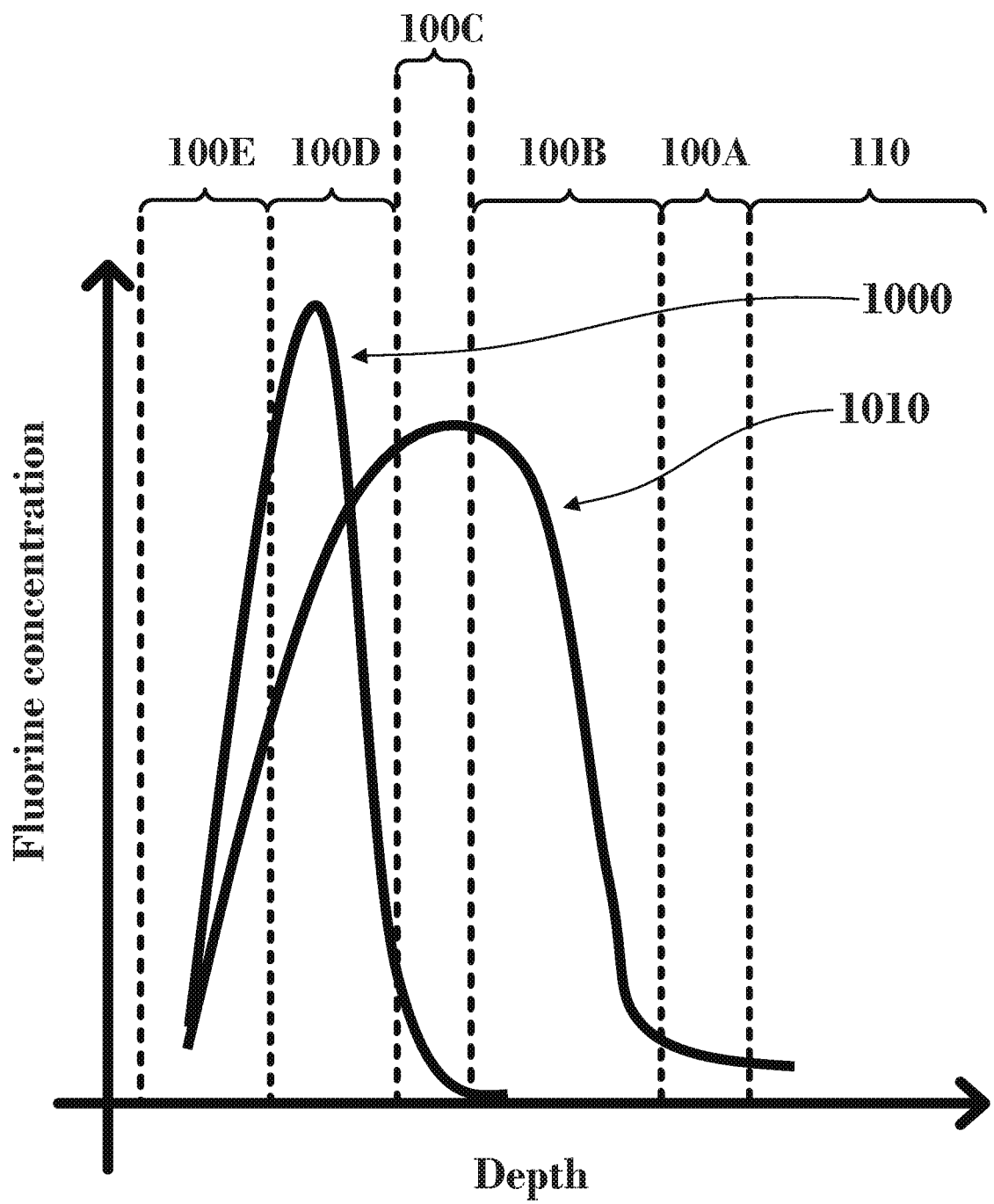
FIG. 10 is a secondary ion mass spectrometry (SIMS) plot of two fluorine distribution profiles in a barrier layer, capping layer, high-k dielectric layer, and interfacial dielectric layer of a partially fabricated gate stack, in accordance with some embodiments.

FIG. 10 is a SIMS profile of two fluorine distributions within barrier layer 100D, capping layer 100C, high-k dielectric layer 100B, and interfacial dielectric 100A. The y-axis in FIG. 10 represents the fluorine atomic concentration and the x-axis represents the depth in the stack—with work function stack 100E being the top layer and interfacial dielectric 100A being the bottom layer of the stack. The fluorine distribution plot in FIG. 10 shows two different fluorine (concentration) distributions that have been obtained with and without the optional annealing operation 345. For example, in FIG. 10, after fluorination operation 335, the fluorine distribution within barrier layer 100D (the relative thickness and location of which is represented by the vertical dotted lines) is represented by curve 1000. On the other hand, after the optional annealing operation 345, the fluorine distribution within barrier layer 100D is represented by curve 1010. According to some embodiments, fluorine distribution 1010 (e.g., after the optional annealing operation 345) develops a larger FWHM compared to the "original" fluorine distribution 1000 that is obtained during fluorination operation 310. As a result, fluorine distribution 1010 extends into capping layer 100C, high-k dielectric layer 100B, and interfacial dielectric 100A. The resulting "wider" fluorine distribution 1010 is attributed to the diffusion of fluorine atoms during the optional annealing operation 345. In some embodiments, the tail of fluorine distribution 1010 can reach interfacial dielectric 100A. The depth at which the fluorine atoms diffuse into the aforementioned stack depends on the process conditions of the optional annealing operation 345. For example, longer annealing times (e.g., towards about 300 s) and higher annealing temperatures (e.g., towards about 550° C.) tend to produce a wider fluorine concentration distribution (e.g., like fluorine distribution 1010), while shorter annealing times (e.g., towards about 2 s) and lower annealing temperatures (e.g., towards about 70° C.) tend to produce a narrow fluorine concentration distribution (e.g., narrower than fluorine distribution 1010 and wider than fluorine distribution 1000).

As discussed above, operations 340, 345, and 350 are optional and are configured to drive in fluorine incorporated in barrier layer 100D in some embodiments, method 300 can perform operation 335 and then proceed directly to operation 355.

Method 300 continues with operation 355, where an $n^{th}$ work function layer is deposited on barrier layer 100D as shown in FIGS. 1 and 2. The number "n" of work function layers deposited can range from 1 to 15, depending upon the number of different threshold voltage transistors required. For example, when "n" is 5, a total of 5 different work function layers (e.g., WF1, WF2, WF3, WF4, WF5 layers) can be deposited to fabricate a total of 6 (n+1) different threshold voltage devices, a subset of which is shown in FIG. 2. In some embodiments, work function layers are blanket deposited with a conformal deposition method, such as for example ALD, PEALD, CVD, PECVD, etc.

In some embodiments, photolithography processes can be used to achieve a different number of work function layers in p-type transistors to produce devices with different nominal threshold voltages. For example, n-type or p-type transistors with fewer number of work function layers may be masked by photoresist, while other p-type transistors receive additional work function layers. Alternatively, n-type or p-type transistors with a fewer number of work function layers may be masked prior to the work function layer deposition process and un-masked towards the end of the work function layer deposition process.

Figure 11:
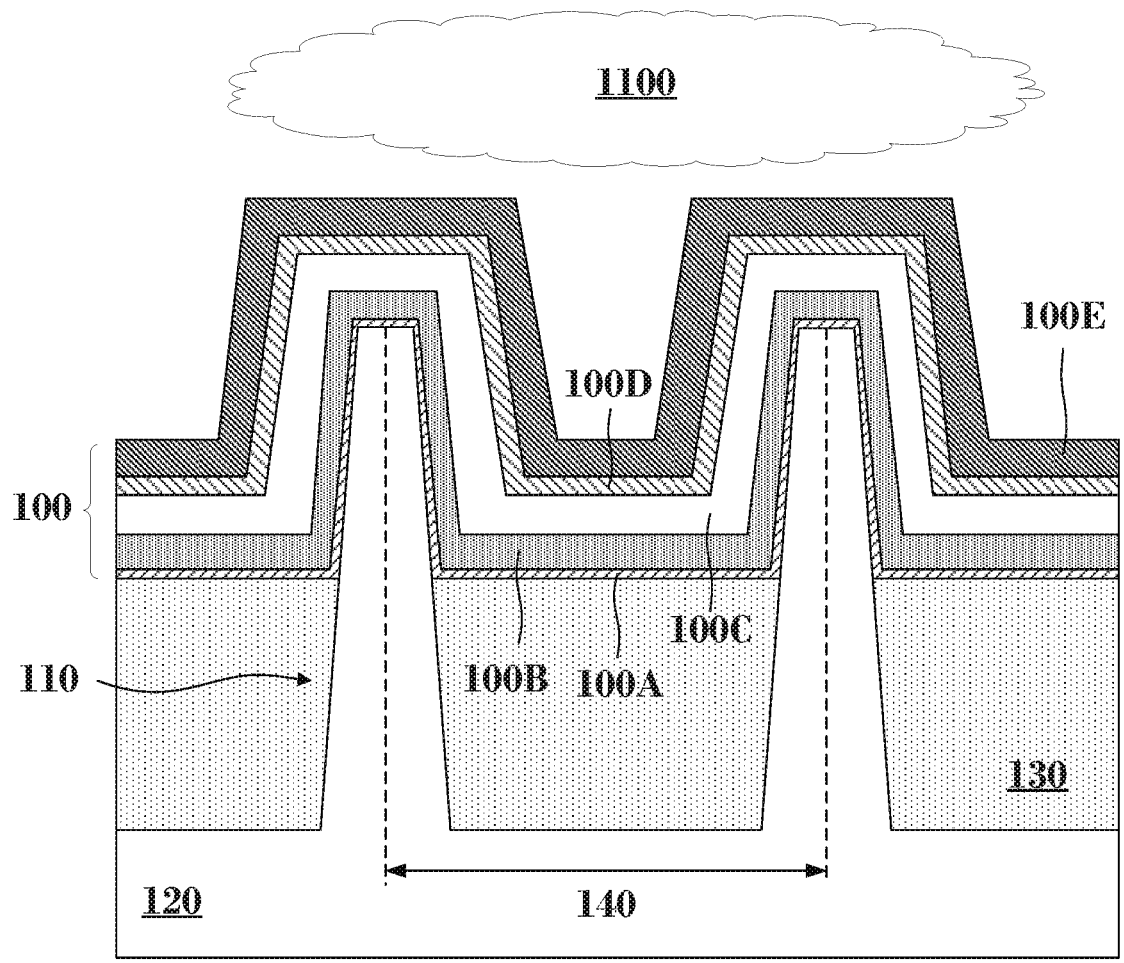
FIG. 11 is a cross-sectional view of a partially fabricated gate stack during a fluorination operation for on one or more work function layers, in accordance with some embodiments.

In some embodiments, an optional fluorination operation can be applied to the work function layers of partially fabricated gate stack 100 to introduce additional amounts of fluorine that can further lower the threshold voltage of the p-type transistor. For example, in optional fluorination operation 360 of method 300, the work function layer WFn (e.g. WF1, and/or WF2, and/or WF3, and/or WF4, and/or WF5), which was deposited in previous operation 355, is exposed (or soaked) to a fluorine-based gas. In some embodiments, fluorination operation 360 is similar to fluorination operations 310 and 335. For example, the fluorine-based gas in fluorination operation 360 can be $F_2$, $NF_3$, $CHF_3$, $CF_4$, $SF_6$, $C_2F_6$, or combinations thereof. Further, the processing temperature of fluorination operation 360 can include temperatures between about 70° C. and about 950° C., while the soaking time can range from about 1 s to about 30 min. Further the ambient pressure during the soaking process can range from about 0.5 Torr to about 150 Torr. FIG. 11 shows the fluorination operation 360 in which the $n^{th}$ work function layer (e.g. WF1 and/or WF2 and/or WF3 and/or WF4 and/or WF5) and/or work function stack 100E is exposed to (e.g., soaked in) a fluorine-based gas 1100.

In some embodiments, an annealing operation, such as annealing operations 320 and 345, can also be performed after fluorination operation 360.

In some embodiments, fluorination operation 360 can be selectively performed on only one of the work function layers to selectively decrease the threshold voltage of a subset of the formed p-type transistors. For example, operation 360 can be performed on work function layer WF1 to selectively decrease the threshold voltage of p-type transistor 220 shown in FIG. 2. In another example, operation 360 can be performed on work function layer WF2 to selectively decrease the threshold voltage of p-type transistors 210 and 220 shown in FIG. 2. If work function layer WF2 undergoes fluorination operation 360, p-type transistor 210 will obtain a lower threshold voltage than p-type transistor 220 since work function layer WF2 in p-type transistor 210 is closer to the channel region of fin 110 when compared to work function layer WF2 in p-type transistor 220.

Figure 12:
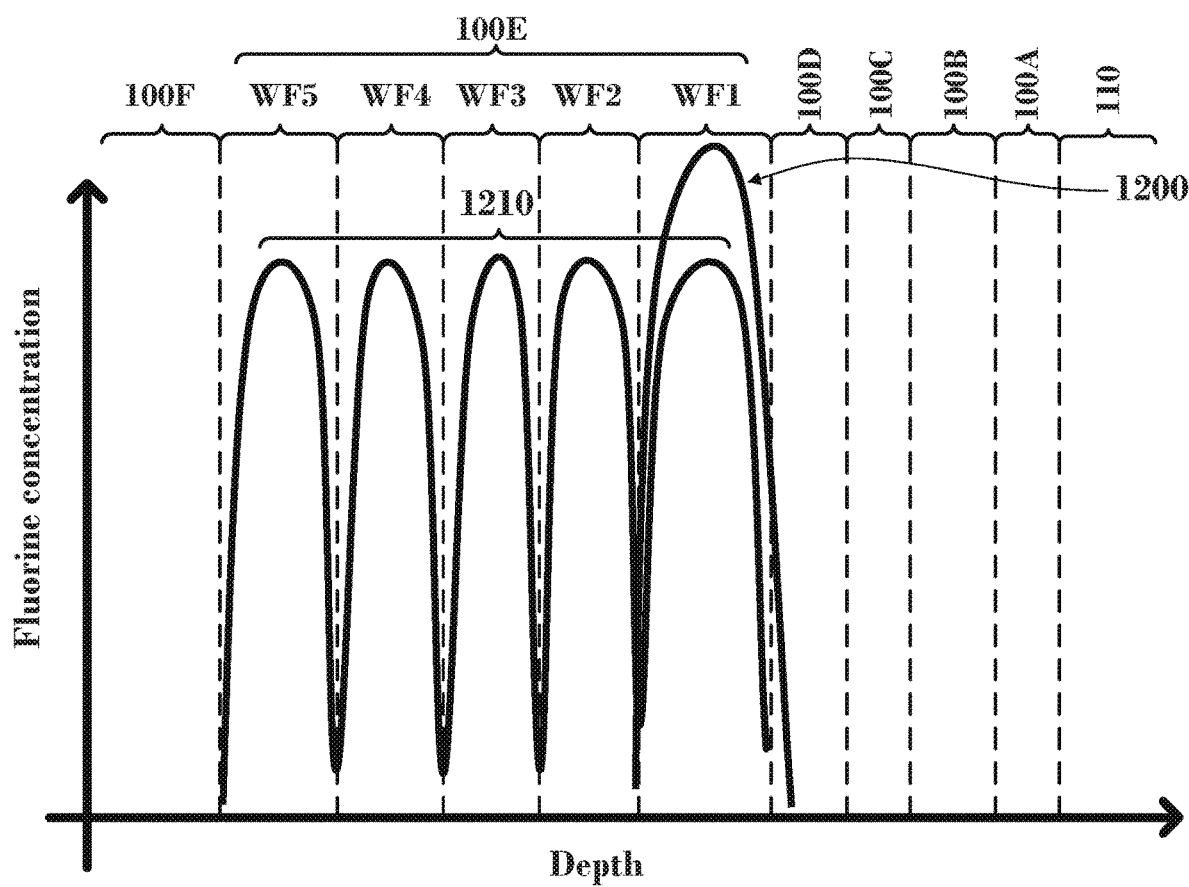
FIG. 12 is a secondary ion mass spectrometry (SIMS) plot of two fluorine distribution profiles in a work function stack of a partially fabricated gate stack, in accordance with some embodiments.

According to some embodiments, FIG. 12 is a SIMS profile that shows the fluorine concentration within work function stack 100E for two exemplary fluorine distributions 1200 and 1210. Fluorine distribution 1200 can be obtained if fluorination operation 360 of method 300 is performed selectively on work function layer WF1. Accordingly, fluorine distribution 1210 can be obtained if fluorination operation 360 of method 300 is performed after the deposition of each work function layer (e.g., after the deposition of WF1, after the deposition of WF2, after the deposition of WF3, after the deposition of WF4, and after the deposition of WF5). As such, in fluorine distribution 1210, each work function layer (Wn) has its own fluorine peak, which corresponds to each fluorination operation 360. Fluorine distribution 1210 increases the effective work function of all the work function layers (e.g., WF1, WF2, WF3, WF4 and WF5), according to some embodiments.

In some embodiments, and after operation 355 or optional fluorination operation 360, metal gate layer 100F can be deposited, according to operation 370. In some embodiments, metal gate layer 100F is blanket deposited on barrier layer 100D or on work function stack 100E. As discussed above, metal gate layer 100F can include a titanium-aluminum alloy or a tantalum-aluminum alloy. In some embodiments, partially fabricated gate stack 100 includes additional layers such as metal or metallic fill layers, glue layers, contact layers etc. In some embodiments, a metal fill is deposited on gate layer 100F to fill the area between adjacent fins 110.

In some embodiments, fluorination operations 310 and 335 can be performed in both p-type and n-type transistors so that both types of transistors can benefit from the elevated levels of fluorine in their gate stacks. For example, elevated fluorine concentration in n-type transistors can improve the quality of high-k dielectric layer 100B and interfacial dielectric 100A by removing carbon, chlorine, or other byproducts originating from the deposition process of high-k dielectric layer 100B and by reducing trap centers at the interface between high-k dielectric layer 100B and interfacial dielectric 100A as discussed above. One the other hand, fluorination operation 360 can be reserved for p-type transistors—however, this is not limiting and n-type transistors may be subjected to fluorination operation 360 with minimal impact on their threshold voltage.

In some embodiments, and referring to FIGS. 2, 3A and 3B, fluorination operations 310 and 335 and 360 of method 300 can be performed after the deposition of interfacial dielectric 100A, after the nitridation of interfacial dielectric 100A, after the deposition of high-k dielectric layer 100B, before, after the deposition of barrier layer 100D, after the deposition of work function layer WF1, after the deposition of work function layer WF2, after the deposition of work function layer WF3, after the deposition of work function layer WF4, after the deposition of work function layer WF5, or combinations thereof.

In some embodiments, the process parameters governing fluorination operations 310, 335 and 360 can be adjusted based on the desired amount of fluorine incorporation required in the gate stack, the desired profile of fluorine required in the gate stack, thermal budget considerations, the fabrication stage of the partially fabrication gate stack 100, and the total number of fluorination operations completed during the formation of partially fabricated gate stack 100.

In some embodiments, the effectiveness of the fluorination process in lowering the threshold voltage value of p-type transistors is stronger when performed closer to the vicinity of barrier layer 100D, and progressively weakens when it is performed further away from barrier layer 100D (e.g., at work function layer WF5).

In some embodiments, method 300 is not limited to finFETs and can be applied to other types of p-type transistors, such gate all around (GAA) transistors including (e.g., lateral gate all around (LGAA) transistors, vertical gate all around (VGAA) transistors, etc.), or to any transistor that can benefit from an increase in the fluorine concentration of its gate stack.

In some embodiments, work function layers 100E can be directly deposited on gate dielectric layer 100B, e.g., without a capping layer and/or barrier layer therebetween. This can be achieved by skipping the depositions of capping layer 100C and/or barrier layer 100D (e.g., by skipping operation 330 in method 300). Alternatively this can also be achieved with additional processing, such as removing capping layer 100C and barrier layer 100D prior to the deposition of work function stack 100E with a wet etching process and/or a dry etching process. For example, referring to 300, a wet or a dry etching process can remove capping layer 100C and/or barrier layers 100D prior to the work function layer deposition in operation 355. In some embodiments, the wet etching chemistry can include HPM, ammonium hydroxide, phosphoric acid, and/or hydrofluoric acid. The dry etching process can include chloride or fluoride based gases, such as tungsten hexafluoride ($WF_6$), tungsten penta-chloride ($WCl_5$), tungsten hexa-chloride ($WCl_6$), tantalum chloride, or titanium chloride ($TiCl_4$).

Embodiments of the present disclosure are directed to a fluorination method for gate stack layers of transistors that achieves incorporation of fluorine concentration between about 0.01 at. % to about 35 at. %. Additionally, the fluorination method described herein can be applied to one or more layers of the gate stack, including the interfacial dielectric, the high-k dielectric, the barrier layer, and any of the work function layers of the gate stack. Further, the fluorine incorporation in the gate stack layers, as described herein, does not involve implants or high energy (e.g., plasma) processing that could damage the gate stack layers. In some embodiments, the fluorination method includes soaking the one or more gate stack layers to a fluorine-based gas (e.g., fluorine gas, nitrogen trifluoride, fluoroform, tetrafluoromethane, sulfur hexafluoride, hexafluoroethane, or combinations thereof) at temperatures between about 70° C. and about 950° C. If the fluorination method is performed on the gate dielectric, an optional annealing operation can be performed to modulate the fluorine distribution within the gate dielectric layer's, barrier layer, work function layer/s. A sacrificial blocking layer can be used to prevent out diffusion of fluorine during the annealing operation. In some embodiments, fluorine incorporation in the gate dielectric improves the quality and reliability of high-k dielectric and the interfacial dielectric for both n-type and p-type transistors. In some embodiments, fluorine incorporation in the barrier layer and/or work function layers improves the effective work function of barrier and/or work function layer thereby decreasing threshold voltage of p-type transistors and also partially improves the quality and reliability of gate dielectric layers for both n-type and p-type transistors.

In some embodiments, a method includes forming a fin on a substrate and a gate dielectric stack on the fin, where the gate dielectric stack comprises a high-k dielectric layer disposed on an interfacial dielectric layer. The method further includes soaking the high-k dielectric layer in a fluorine-based gas and depositing a capping layer on the high-k dielectric layer.

In some embodiments, a transistor structure includes a substrate with a fin thereon. The transistor structure further includes a gate dielectric stack on the fin, where the gate dielectric stack includes an interfacial dielectric layer and a high-k dielectric layer on the interfacial dielectric layer with a fluorine concentration between about 0.01 atomic % and about 35 atomic %. The transistor also includes one or more work function layers on the gate dielectric stack.

In some embodiments, a method includes forming an interfacial dielectric on fins disposed on a substrate, depositing a high-k dielectric layer on the interfacial dielectric, depositing one or more work function layers on the high-k dielectric layer, heating the substrate to a temperature between about 70° C. and about 950° C., and soaking at least one of the one or more work function layers in the fluorine-based gas.

It is to be appreciated that the Detailed Description section, and not the Abstract of the Disclosure section, is intended to be used to interpret the claims. The Abstract of the Disclosure section may set forth one or more but not all possible embodiments of the present disclosure as contemplated by the inventors), and thus, are not intended to limit the subjoined claims in any way.

The foregoing disclosure outlines features of several embodiments so that those skilled in the art may better understand the aspects of the present disclosure. Those skilled in the art will appreciate that they may readily use the present disclosure as a basis for designing or modifying other processes and structures for carrying out the same purposes and/or achieving the same advantages of the embodiments introduced herein. Those skilled in the art will also realize that such equivalent constructions do not depart from the spirit and scope of the present disclosure, and that they may make various changes, substitutions, and alterations herein without departing from the spirit and scope of the present disclosure.

What is claimed is:

1. A method comprising:
    forming an interfacial dielectric on fins disposed on a substrate;
    depositing a high-k dielectric layer on the interfacial dielectric;
    depositing one or more work function layers on the high-k dielectric layer;
    heating the substrate to a temperature between about 70° C. and about 950° C.; and
    soaking at least one of the one or more work function layers in a fluorine-based gas to dope the at least one of the one or more work function layers while heating the substrate.

2. The method of claim 1, wherein soaking the at least one of the one or more work function layers in the fluorine-based gas comprises soaking the at least one of the one or more work function layers in fluorine gas ($F_2$), nitrogen trifluoride ($NF_3$), fluoroform ($CHF_3$), tetrafluoromethane ($CF_4$), sulfur hexafluoride ($SF_6$), hexafluoroethane ($C_2F_6$), or combinations thereof to incorporate fluorine in the at least one of the one or more work function layers.

3. The method of claim 1, further comprising, prior to depositing the high-k dielectric layer, soaking the interfacial dielectric in the fluorine-based gas to dope the interfacial dielectric with fluorine while heating the substrate.

4. The method of claim 1, wherein soaking the at least one of the one or more work function layers in the fluorine-based gas comprises soaking the at least one of the one or more work function layers at an ambient pressure between about 0.5 Torr and about 150 Torr.

5. The method of claim 1, further comprising, prior to depositing the one or more work function layers:
    depositing a barrier layer on the high-k dielectric layer;
    soaking the barrier layer in the fluorine-based gas at a temperature between about 70° C. and about 950° C.;
    depositing a sacrificial blocking layer on the barrier layer;
    annealing the substrate at a temperature between about 70° C. and about 550° C.; and
    removing the sacrificial blocking layer.

6. The method of claim 1, wherein soaking the at least one or more work function layers comprises performing an implantation-free soaking process on the at least one or more work function layers.

7. The method of claim 1, wherein soaking the at least one or more work function layers comprises performing a plasma-free soaking process on the at least one or more work function layers.

8. The method of claim 1, further comprising:
    depositing a sacrificial blocking layer over and in contact with the high-k dielectric layer;
    annealing the substrate with the high-k dielectric layer being capped with the sacrificial blocking layer;
    removing the sacrificial blocking layer;
    depositing a capping layer over and in contact with the annealed high-k dielectric layer; and
    depositing a barrier layer over the capping layer and under the one or more work function layers.

9. A method, comprising:
    forming an interfacial dielectric over a fin structure of a substrate;
    depositing a high-k dielectric layer over the interfacial dielectric;
    depositing a first work function layer over the high-k dielectric layer;
    doping the first work function layer with fluorine by soaking the first work function layer in a fluorine-based gas;
    depositing a second work function layer over the soaked first work function layer; and
    doping the second work function layer with fluorine by soaking the second work function layer in the fluorine-based gas.

10. The method of claim 9, wherein doping the first work function layer comprises soaking the first work function layer with one of fluorine gas ($F_2$), nitrogen trifluoride ($NF_3$), fluoroform ($CHF_3$), tetrafluoromethane ($CF_4$), sulfur hexafluoride ($SF_6$), and hexafluoroethane ($C_2F_6$) at a temperature between about 70° C. and about 950° C.

11. The method of claim 9, wherein doping the first work function layer comprises exposing a surface of the first work function layer to the fluorine-based gas, and wherein depositing the second work function layer comprises depositing the second work function layer over and in contact with the surface of the first work function layer.

12. The method of claim 9, further comprising:
    depositing a capping layer over the high-k dielectric layer; and
    depositing a barrier layer over the capping layer and under the first work function layer.

13. The method of claim 12, further comprising:
    doping the barrier layer with fluorine by soaking the barrier layer in the fluorine-based gas while heating the substrate;
    depositing a sacrificial blocking layer over the barrier layer;
    annealing the substrate at a temperature between about 70° C. and about 550° C. with the sacrificial layer being over the barrier layer; and
    removing the sacrificial blocking layer.

14. The method of claim 9, further comprising depositing an aluminum-contained gate metal layer over the second work function layer.

15. A method, comprising:
    forming an interfacial dielectric over a substrate;
    depositing a high-k dielectric layer over the interfacial dielectric;
    depositing a first work function layer over the high-k dielectric layer;
    soaking the first work function layer in a fluorine-based gas to dope the first work function layer with fluorine while heating the substrate;
    depositing a second work function layer over the soaked first work function layer; and
    depositing a gate metal layer over the second work function layer with the second work function layer being free from fluorine.

16. The method of claim 15, wherein soaking the first work function layer comprises exposing the first work function layer to one of fluorine gas ($F_2$), nitrogen trifluoride ($NF_3$), fluoroform ($CHF_3$), tetrafluoromethane ($CF_4$), sulfur hexafluoride ($SF_6$), and hexafluoroethane ($C_2F_6$).

17. The method of claim 15, further comprising depositing a barrier layer over the high-k dielectric layer, and wherein depositing the first work function layer comprises depositing the first work function layer over a first portion of the barrier layer with a second portion of the barrier layer being exposed.

18. The method of claim 17, wherein depositing the second work function layer comprises depositing the second work function layer over and in contact with the second portion of the barrier layer.

19. The method of claim 17, further comprising depositing a capping layer over the high-k dielectric layer and under the barrier layer.

20. The method of claim 19, further comprising:
depositing a sacrificial blocking layer over the barrier layer;
annealing the substrate at a temperature between about 70° C. and about 550° C.; and
removing the sacrificial blocking layer.

* * * * *